(12) United States Patent
Atallah et al.

(10) Patent No.: US 6,603,339 B2
(45) Date of Patent: Aug. 5, 2003

(54) PRECISION ALIGNED MULTIPLE CONCURRENT DUTY CYCLES FROM A PROGRAMMABLE DUTY CYCLE GENERATOR

(75) Inventors: Francois I. Atallah, Raleigh, NC (US); Anthony Correale, Jr., Raleigh, NC (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 10/017,744

(22) Filed: Dec. 14, 2001

(65) Prior Publication Data

US 2003/0112045 A1 Jun. 19, 2003

(51) Int. Cl.[7] .............................................. H03K 3/017
(52) U.S. Cl. ....................................... 327/175; 327/152
(58) Field of Search ................................ 327/170, 172, 327/175, 176, 145, 149, 150, 152, 158, 159, 161, 261, 263, 271, 274

(56) References Cited

U.S. PATENT DOCUMENTS

| 4,414,637 A | 11/1983 | Stanley ........................ 364/569 |
| 4,482,826 A | 11/1984 | Ems et al. .................... 327/270 |
| 4,881,041 A | 11/1989 | Kawanabe et al. .......... 327/167 |
| 5,133,064 A | * 7/1992 | Hotta et al. .................. 327/156 |
| 5,157,277 A | 10/1992 | Tran et al. ................... 327/156 |
| 5,231,320 A | 7/1993 | Kase ............................ 327/277 |
| 5,302,920 A | 4/1994 | Bitting ......................... 331/45 |
| 5,349,311 A | 9/1994 | Mentzer ....................... 331/57 |
| 5,394,114 A | 2/1995 | Davis ........................... 331/1 A |
| 5,406,590 A | 4/1995 | Miller et al. ................. 375/376 |
| 5,451,893 A | 9/1995 | Anderson ..................... 327/174 |
| 5,563,605 A | 10/1996 | McEwan ...................... 342/202 |
| 5,903,747 A | 5/1999 | Casal .......................... 395/556 |
| 5,923,200 A | 7/1999 | Shimizume ................. 327/277 |
| 5,933,039 A | 8/1999 | Hui et al. ..................... 327/262 |
| 5,949,292 A | 9/1999 | Fahrenbruch et al. ......... 331/57 |
| 6,028,491 A | 2/2000 | Stanchak et al. ............. 331/75 |
| 6,038,255 A | * 3/2000 | Palmer et al. ................ 327/175 |
| 6,104,228 A | * 8/2000 | Lakshmikumar ............ 327/407 |
| 6,181,178 B1 | * 1/2001 | Choi ............................ 327/158 |
| 6,333,655 B1 | * 12/2001 | Ishizuka ...................... 327/175 |
| 6,384,651 B1 | * 5/2002 | Horigan ...................... 327/164 |
| 6,448,828 B2 | * 9/2002 | Stark et al. .................. 327/170 |
| 6,518,811 B1 | * 2/2003 | Klecka, III .................. 327/276 |

FOREIGN PATENT DOCUMENTS

JP            4000910        1/1992

\* cited by examiner

*Primary Examiner*—My-Trang Nu Ton
(74) *Attorney, Agent, or Firm*—Scully, Scott, Murphy & Presser, P.C.; Scott W. Reid

(57) ABSTRACT

An incoming signal's duty cycle is transformed to a known value by a first programmable duty cycle generator, and the output of the first programmable duty cycle generator is applied to a second programmable duty cycle generator which includes multiple stages which provide multiple duty cycle tap point outpoints, each having a different known value of a precise duty cycle, wherein the leading edges or trailing edges of the multiple duty cycle tap point output signals are phase aligned with respect to each other by voltage controlled delay matching elements which are replicas of the stages of the second duty cycle generator.

20 Claims, 6 Drawing Sheets

PRECISION ALIGNED MULTIPLE CONCURRENT DUTY CYCLES FROM A PROGRAMMABLE DUTY CYCLE GENERATOR

BACKGROUND OF THE INVENTION

1. Field of the Invention

The present invention relates generally to a precise and programmable duty cycle generator which employs multiple duty cycle generators connected in series to provide multiple duty cycle tap point outputs, each with a different known and precise duty cycle and each having precisely phase aligned leading or trailing edges.

Almost all ICs require a clock signal to accomplish their operations and be synchronous with other related components. The frequency of this clock determines the performance of the IC. As sub-micron technologies allow designs to operate at higher frequencies, design techniques must also provide for increasing their performance. An adjustable duty cycle clock circuit provides designers with flexibility in their designs, allowing them to meet high-performance and low-power goals. In addition to this flexibility, a programmable duty cycle adjuster provides robustness to the design. After fabrication, if the process was not modeled accurately, the duty cycle can be adjusted through the IC bus, fuses, or primary pins on the IC to operate the IC at the highest possible clock rate.

In a clocking system, phase aligned clock signals are imperative. Generally a PLL is used to generate an on-chip clock signal of the desired frequency from a reference clock oscillator of lower frequency. The PLL ensures that the output clock signal is phase aligned with respect to the input reference clock oscillator.

A prior disclosure, filed as U.S. patent application Ser. No. 10/020,528, filed on even date herewith and titled, "A Precise And Programmable Duty Cycle Generator", is hereby expressly incorporated by reference herein and describes a circuit to generate/create a user definable duty cycle with precision from an input signal having any duty cycle, and is described with reference to FIGS. 1–5 herein. As explained in that disclosure, for a fixed number of delay stages the range of duty cycle selection is inversely proportional to the frequency of the signal at CLKIN.

A prior disclosure, filed as U.S. patent application Ser. No. 10/017,071, filed on even date herewith, and entitled "Enhanced Operational Frequency for a Precise and Programmable Duty Cycle Generator", is hereby expressly incorporated by reference herein and describes a circuit to further enhance the operation frequency range and precision of the previously disclosed circuit configuration for producing a user definable duty cycle with precision. That scheme allows the precise and programmable duty cycle circuit to support a wider range of frequencies and duty cycle sensitivities which are now selectable. Applications wherein the incoming frequency is variable or selectable can readily employ this approach and have the desired output duty cycle without loss of precision.

A prior disclosure, filed as U.S. patent application Ser. No. 10/020,533, filed on even date herewith, and titled "Multiple Duty Cycles Tap Points For A Precise And Programmable Duty Cycle Generator", is hereby expressly incorporated by reference herein and describes a circuit to generate multiple different duty cycles from any input duty cycle, and is described with reference to FIGS. 1–8 herein.

Pursuant to the present invention, the duty cycle generation schemes of the prior disclosures are employed in concert with a PLL to produce the desired duty cycle signal. The various tap points of the multiple duty cycles as disclosed in U.S. patent application Ser. No. 10/020,533, filed Dec. 14, 2001, are precise with respect to the desired duty cycle, but are shifted in time and phase with respect to each other, and the present invention precisely phase aligns the leading or trailing edges of the multiple duty cycle signals.

2. Discussion of the Prior Art

The idea of providing a circuit for duty cycle correction isn't new. The prior art has circuits which correct an incoming signal's duty cycle to a fixed value, typically 50—50. The present invention differs from the prior art by allowing the output corrected signal to be programmable to any value duty cycle with precision.

Most prior art circuits provide only 50/50 duty cycles without the ability to provide other duty cycles. U.S. Pat. No. 4,881,041 discloses a circuit to correct an incoming signal's duty cycle to a 50/50 duty cycle, and is limited to a 50/50 duty cycle correction with no provision for any other duty cycle, and the circuit is completely different from the present invention. U.S. Pat. No. 5,157,277 discloses a circuit to convert a sine wave input clock signal at a 50/50 duty cycle into a square wave signal with a variable duty cycle. The conversion circuit is limited to sine wave inputs, and is significantly different from the present invention which addresses square wave signals.

SUMMARY OF THE INVENTION

Accordingly, it is a primary object of the present invention to provide a precise programmable duty cycle generator which employs multiple duty cycle generators connected in series to provide multiple duty cycle tap point outputs, each with a known and precise value of a duty cycle from a source input signal having any duty cycle, and which aligns the leading edges or trailing edges of multiple duty cycle tap point output signals from a programmable duty cycle generator.

The present invention transforms an incoming signal's duty cycle to a known value by a first programmable duty cycle generator, and then applies the output of the first programmable duty cycle generator to a second programmable duty cycle generator which provides multiple duty cycle tap point outpoints, each having a different known value of a precise duty cycle, wherein the leading edges or trailing edges of the multiple duty cycle tap point output signals are phase aligned with respect to each other.

The present invention generates multiple concurrent duty cycle output signals with precision from an input signal having any duty cycle, and further provides that each of the multiple and programmable duty cycle tap point output signals are phase aligned with respect to each other and the source input signal.

BRIEF DESCRIPTION OF THE DRAWINGS

The foregoing objects and advantages of the present invention may be more readily understood by one skilled in the art with reference being had to the following detailed description of several embodiments thereof, taken in conjunction with the accompanying drawings wherein like elements are designated by identical reference numerals throughout the several views, and in which.

DETAILED DESCRIPTION OF THE INVENTION

High Level Overview

A programmable duty cycle generator circuit is comprised of:

(i) a set of register bits holding the digitally encoded duty cycle data;

(ii) an n-bit Digital-to-Analog Converter (DAC) used to convert the digitally encoded desired duty cycle into an analog voltage;

(iii) an Operational Transconductance Amplifier (OTA) used to compare the analog voltage representing the desired duty cycle with an analog feedback voltage;

(iv) a Voltage Controlled Duty Cycle Generator (VCDCG) which generates the desired duty cycle; and (v) a Low Pass Filter (LPF) which generates an analog voltage which is the feedback signal fed to the OTA thereby providing the closed loop operation.

Figure 1:
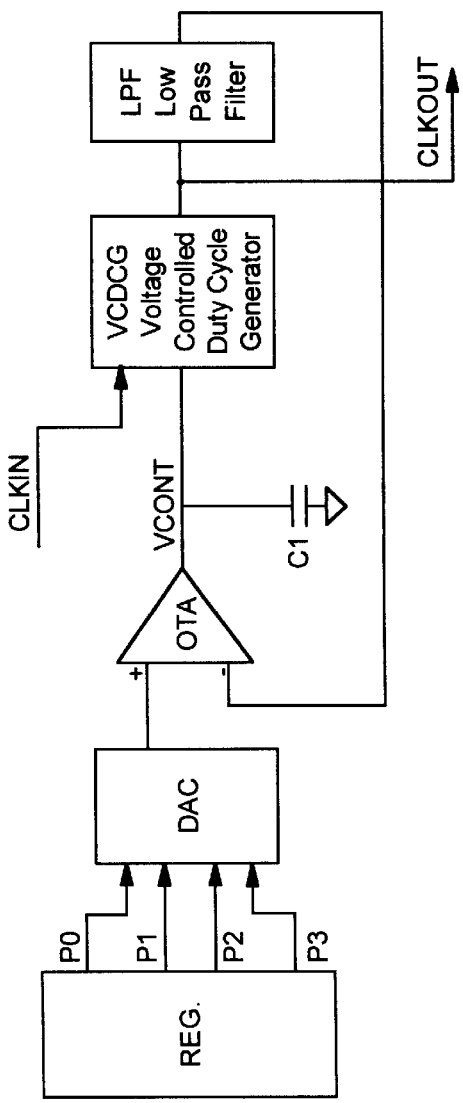
FIG. 1 is a block diagram of a single-ended programmable duty cycle correction circuit.

The inputs to the VCDCG are an input clock signal and the output of the OTA. The output of the VCDCG is the duty cycle corrected clock. FIG. 1 illustrates this basic configuration in a block diagram of one embodiment of a single-ended programmable duty cycle generator circuit. The programmable duty cycle generator circuit of FIG. 1 represents a single-ended implementation. A differential implementation which has higher noise immunity can be employed using the teachings of this disclosure and known differential techniques, and is discussed in greater detail in U.S. Patent Application filed as Ser. No. 10/020,528, on even date herewith, and titled "A Precise And programmable Duty Cycle Generator".

The Low Pass Filter (LPF) is the duty cycle measuring circuit whose output voltage is subtracted in the Operational Transconductance Amplifier (OTA) from a reference voltage generated from the DAC whose inputs, P0 through P3, set the equivalent DC voltage associated with the duty cycle desired. In this illustration, four inputs, P0–P3, define the encoded desired duty cycle. The OTA (Operational Transconductance Amplifier) generates a current that is proportional to the difference of its input voltages. If the two voltages are equal, then no current will charge or discharge the capacitor C1 leading to a DC voltage at VCONT that forces the waveform at CLKOUT to be equal to the desired duty cycle. On the other hand, if the duty cycle at CLKOUT is less than the desired duty cycle, then the output of the Low Pass Filter will be smaller than the output of the DAC. The OTA will generate a current proportional to the difference between the output of the DAC and the output of the Low Pass Filter. The current will charge the capacitor causing VCONT to rise and the duty cycle at CLKOUT to increase. The mechanism is the same but in the other direction if the duty cycle of CLKOUT is greater than the desired duty cycle. Note that the Voltage Controlled Duty Cycle Generator (VCDCG) inverts CLKIN. If a non-inverting signal is desired, the output of the DAC and the output of the Low Pass Filter should be swapped going into the OTA.

FIG. 1 illustrates a generic embodiment of a programmable duty cycle generator. The register and the DAC provide the programmable function to the duty cycle generator, and function to generate a programmable DC voltage representative of the desired duty cycle. A nonprogrammable embodiment of a duty cycle generator might substitute a fixed DC voltage input to the OTA.

Figure 2:
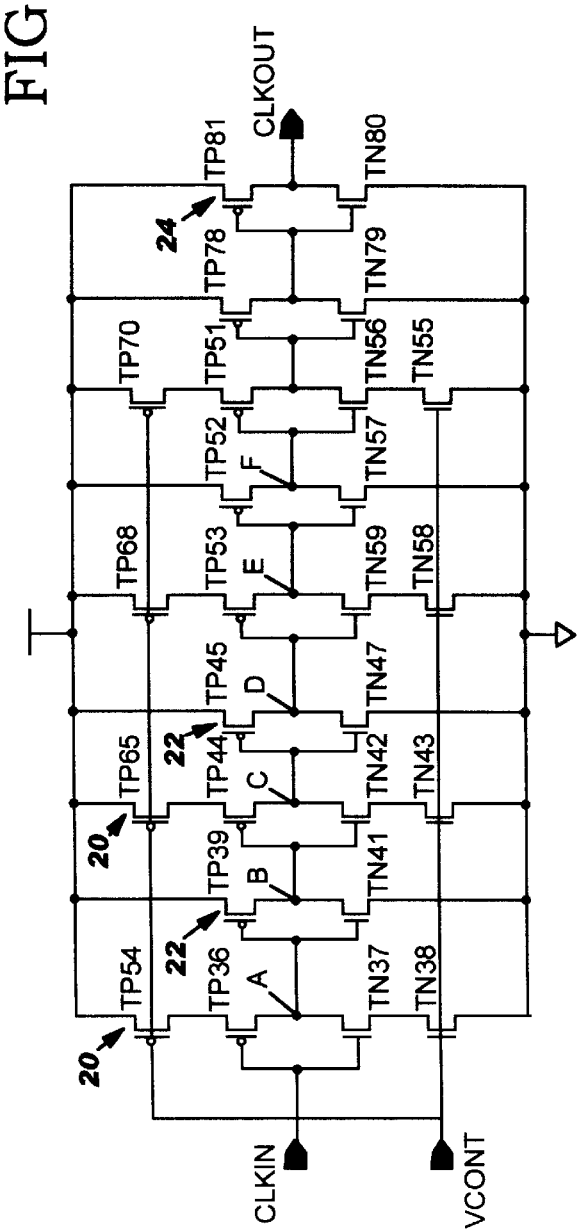
FIG. 2 illustrates a Voltage Controlled Duty Cycle Generator (VCDCG) which is a very important aspect of the present invention.

FIG. 2 illustrates an embodiment of a Voltage Controlled Duty Cycle Generator (VCDCG) which is a very important aspect of the present invention.

The Voltage Controlled Duty Cycle Generator is comprised of a plurality of current starved inverters 20, each of which comprises 2 PFETs: The top PFET (e.g. TP54 in stage 1) serves as a current source while the second PFET (e.g. TP36 in stage 1) in series serves a switch, and 2 NFETs: The bottom NFET (e.g. TN38 in stage 1) serves as a current source while the second NFET (e.g. TN37 in stage 1) in series serves as a switch. These are followed by a series inverter 22 which presents a capacitive load to the current sources, to provide either additive or subtractive duty cycle corrections. The plurality of current starved inverters are controlled by the output control signal voltage VCONT of the operational amplifier which is connected to both the PFET current sources and the NFET current sources. The multiple stages of 20–22 are followed by a final conventional inverter 24 to provide a desired polarity clock pulse. The conventional inverter 24 can be omitted to provide opposite polarity clock pulses.

Unlike a conventional current starved inverter, the VCONT signal is connected to both the PFET current sources (TP64, TP66, TP68, or TP70) as well as the NFET current sources (TN38, TN43, TN58, or TN55). As the voltage at VCONT increases, the PFET current source will provide a smaller current to charge the capacitive load of the series inverter 22, and the NFET current source will provide a larger current to discharge the capacitive load of the series inverter 22. Therefore, at the output of each current starved inverter 20 the waveform has a slow rising edge and a fast falling edge. Because of the difference in edge rates, the output of each CMOS inverter 22 will have a longer falling delay (tphl) than the rising delay (tplh). This difference in delays produces a duty cycle correction that is controlled by VCONT. This mode of operation is reversed when the voltage at VCONT decreases.

Figure 3:
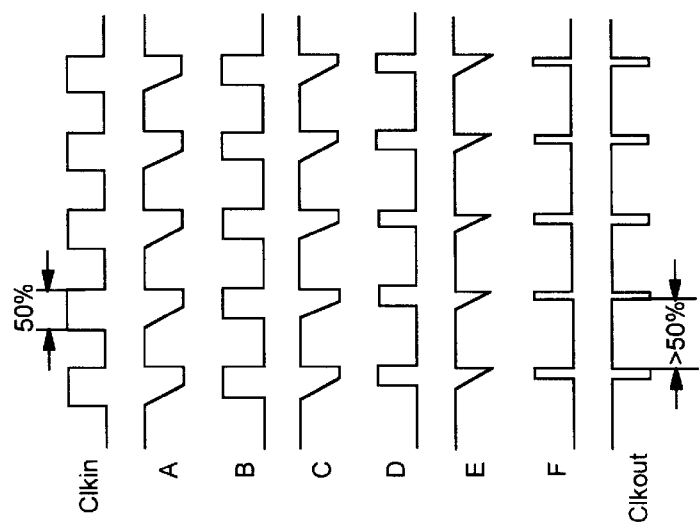
FIG. 3 illustrates a timing diagram for a 3-stage VCDCG for the case where a longer uptime is desired.

FIG. 3 illustrates a timing diagram for a 3-stage VCDCG for the case where a longer uptime is desired, wherein the waveforms A–F correspond to the nodes A–F of FIG. 2. As can be seen, the falling transitions associated with the output stages of the current starved inverters (nodes A, C and E) is 'slow' and rising transitions are crisp. The inverters following the current starved inverters invert the signals and provide crisp edges. Note however, that the pulse widths have been reduced and continue to be reduced as the signals propagate down the line. The final inverter 24 in the VCDCG reshapes the signal with crisp edges and supports the needed output drive, polarity and phase.

Note that while this VCDCG circuit may appear similar to a voltage controlled delay line (VCDL), it is quite a bit different. Typically in a VCDL all the elements are current starved inverters with the possible exception of the output driving section. The goal in a VCDL is to control delay, not duty cycle. In fact, the duty cycle within a VCDL is kept relatively constant There are generally two voltage controls used within the VCDL; one for the PFETS, VCONTP, and another for the NFETS, VCONTN. To increase delay, the VCONTP is increased towards the power supply level whereas the VCONTN is decreased towards ground. In essence, the applied control voltages are moving in opposite directions. In contrast, the VCDCG employs a current starved inverter which is immediately followed by a conventional inverter to allow duty cycle corrections to be either additive or subtractive. Also, this circuit is unlike voltage controlled delay lines in that the current starved inverters are controlled by a single voltage, Vcont, and the series inverter isn't voltage controlled at all. The single control voltage causes the current starved inverter's delay to degrade/improve on one transition while improve/degrade on the other transition.

The number of stages needed depends on the frequency of the CLKIN signal and the desired voltage range at the VCONT terminal. For a fixed number of delay blocks, the voltage range at VCONT required to span from the minimum duty cycle to the maximum one is inversely proportional to the frequency of the signal at CLKIN. Therefore, the number of stages can be designed based on the range of expected input frequencies, the allowed voltage span at VCONT, and the desired duty cycle range of the output signal at CLKOUT.

Figure 4:
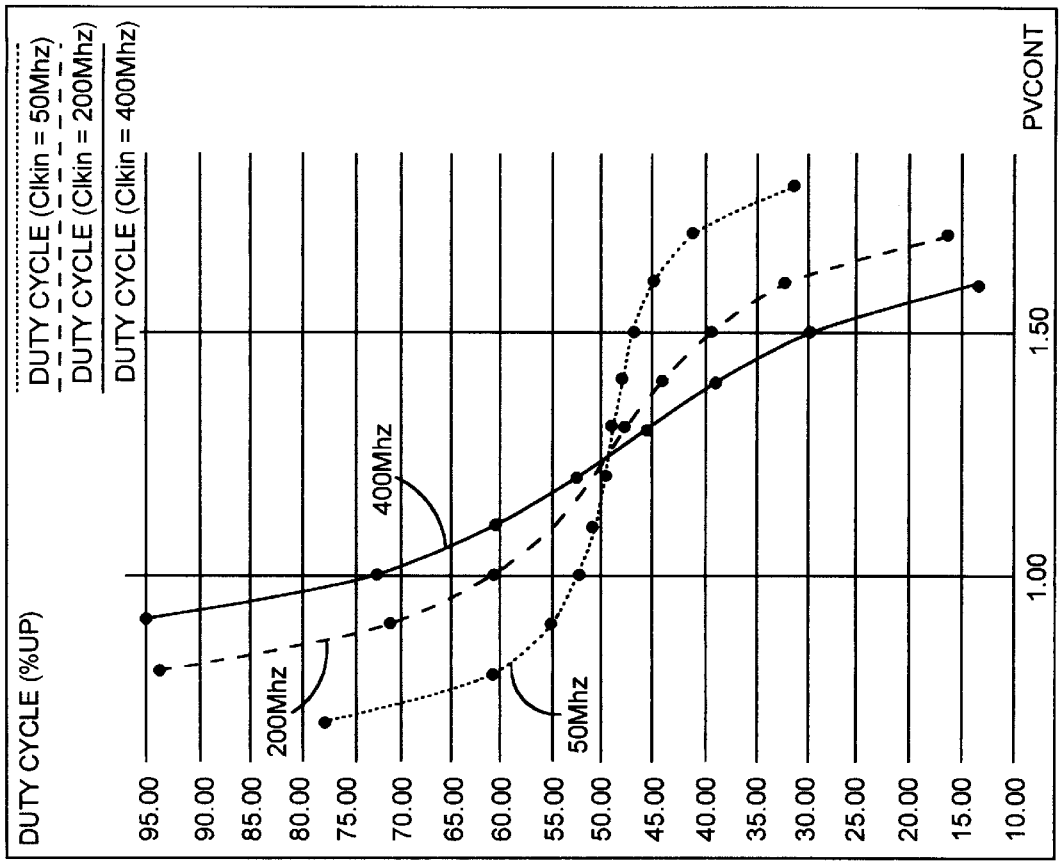
FIG. 4 shows the DUTY CYCLE (%) for a 50 Mhz, 200 Mhz, and a 400 Mhz input clock versus VCONT for a fixed chain length.

FIG. 4 shows the DUTY CYCLE (%) for a 50 Mhz, 200 Mhz, and a 400 Mhz input clock versus VCONT for a fixed chain length.

Examining the 50 MHz curve in FIG. 4 reveals that the duty cycle can be controlled from 78% down to nearly 0% by varying VCONT (the last point on the plot is 32% but by increasing VCONT a lower duty cycle can be achieved). The higher frequency operations for the same number of stages within the VCDCG allow duty cycles to range from nearly 95% down to nearly 0% over a narrower range of VCONT. The shape of the 50 MHz curve relative to the higher frequency curves clearly shows that more precision is available but at the cost of operational duty cycle breadth. Hence, the stage length can be specified for a given frequency to adjust for more precision as well as duty cycle range.

The number of stages of the VCDCG of FIGS. 1 and 2 depends on the frequency of the CLKIN signal and the desired voltage range at the VCONT terminal. For a fixed number of delay blocks, the voltage range at VCONT required to span from the desired minimum duty cycle to the desired maximum duty cycle is inversely proportional to the frequency of the signal at CLKIN. Therefore, as explained in the prior disclosure, the number of stages can be based on the range of expected frequencies, the allowed voltage span at VCONT, and the desired duty cycle range and precision of the output signal at CLKOUT. Pursuant to the present invention, this frequency range limitation can be alleviated by designing the VCDCG with a broad number of delay taps in conjunction with multiple tap points and multiplexing them at the output. The controls of the multiplexor can then select the appropriate frequency range for best duty cycle control.

Figure 5:
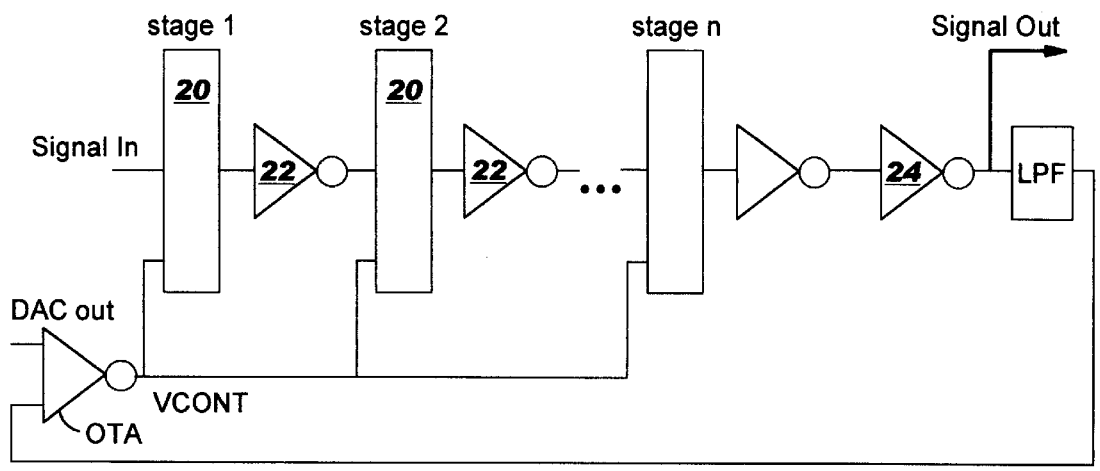
FIG. 5 represents the single-ended programmable duty cycle generator circuit of FIGS. 1 and 2 in block diagram form, wherein the VCDCG section is comprised of n-stages, each having an inverted output, and the last stage is connected to an output inverter.

FIG. 5 represents the single-ended programmable duty cycle correction circuit of FIGS. 1 and 2 in a simplified block diagram form. The VCDCG section is comprised of n-stages 20, each stage 20 having an inverter 22 at its output to provide an inverted output, and the last stage n is connected to the output inverter 24, as explained in further detail with reference to FIG. 2 in particular.

The present invention employs multiple duty cycle generators connected in series to provide multiple duty cycle tap point outputs, each with a known and precise value from a source input signal having any duty cycle. The present invention transforms an incoming signal's duty cycle to a known value by means of a first programmable duty cycle generator, and then applies the output of the first programmable duty cycle generator to a second programmable duty cycle generator which provides multiple duty cycle tap point outpoints, each of known value and precision.

This provides chip designers with an option of clocking various logic elements with clocks of different, but known duty cycles for power and performance optimizations. As was explained in patent application Ser. No. 10/020,528, filed Dec. 14, 2001, not all paths require C1 (capture) clock gating, hence, those not needing it can have wider C1 pulses and improved data setup time. For those requiring a gated C1 clock, a tradeoff between more available time for the generation/creation of the blocking control signal and data setup time is desired and can be achieved by having unique duty cycle management.

Also, since setup is a function of the stability of the power supply, noise generated by the falling edges of C2 (launch) clock pulse in close time proximity with the narrow C1 pulse will adversely degrade the setup time. By employing a "waterfall" effect wherein the various C2 clocks fall at different times, the simultaneous switching noise will be reduced and hence will improve the setup time. This "waterfall" transitioning can be controlled by means of this programmable duty cycle correction scheme.

Also, not all sections of the chip have the same pulse width/duty cycle requirements. Normally the least common denominator approach prevails. This often results in sub-level optimization. By employing multiple concurrent duty cycle correction, each section can have its own optimized duty cycle.

Figure 6:
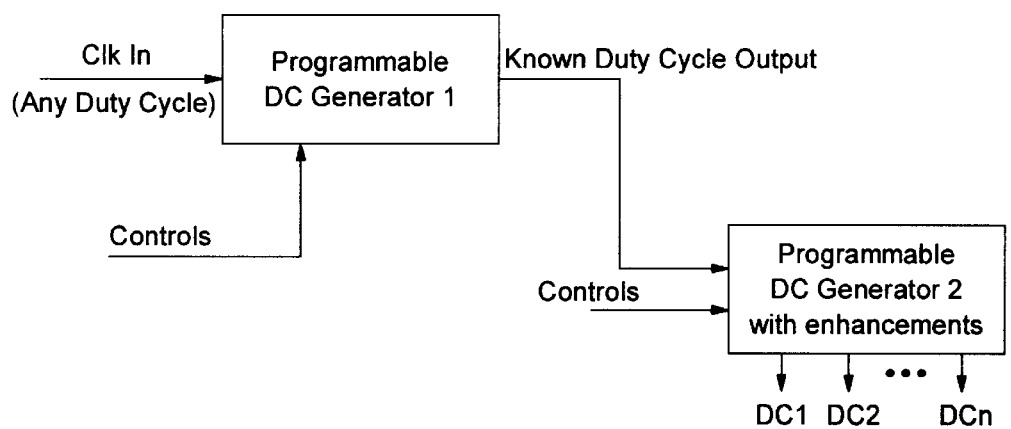
FIG. 6 illustrates an arrangement wherein a first duty cycle generator converts an input source clock's unknown duty cycle to a known and programmable duty cycle, and a second programmable duty cycle generator is connected in series with the output of the first duty cycle generator and produces multiple outputs, DC1, DC2 . . . DCn, each with a known and precise duty cycle value.

FIG. 6 illustrates an arrangement wherein a first duty cycle generator 1 of the type as illustrated in FIG. 1 is employed to convert an input source clock's unknown duty cycle to a known and programmable duty cycle. A second programmable duty cycle generator 2 is connected in series with the output of the first duty cycle generator 1. The second duty cycle generator 2 is a modified configuration, producing multiple outputs, DC1, DC2 . . . DCn, each with a known and precise duty cycle value.

The controls to each DC generator 1,2 are used to select the desired duty cycle at the output. For example, the controls for DC generator 1 could be set to provide a known duty cycle output of 50/50. The controls for DC generator 2 could be set to provide a final duty cycle output of 80/20. Hence, each of the n-taps of DC generator 2 would be a fraction of the difference of the incoming's signal duty cycle, 50/50 in this case, and the 80/20 final or last stage duty cycle output, such as 60/40, 70/30 and finally 80/20. Each of the DC generators could be further enhanced by the techniques outlined in U.S. patent application Ser. No. 10/017, 071, filed Dec. 14, 2001, to improve the operational frequency.

Figure 7:
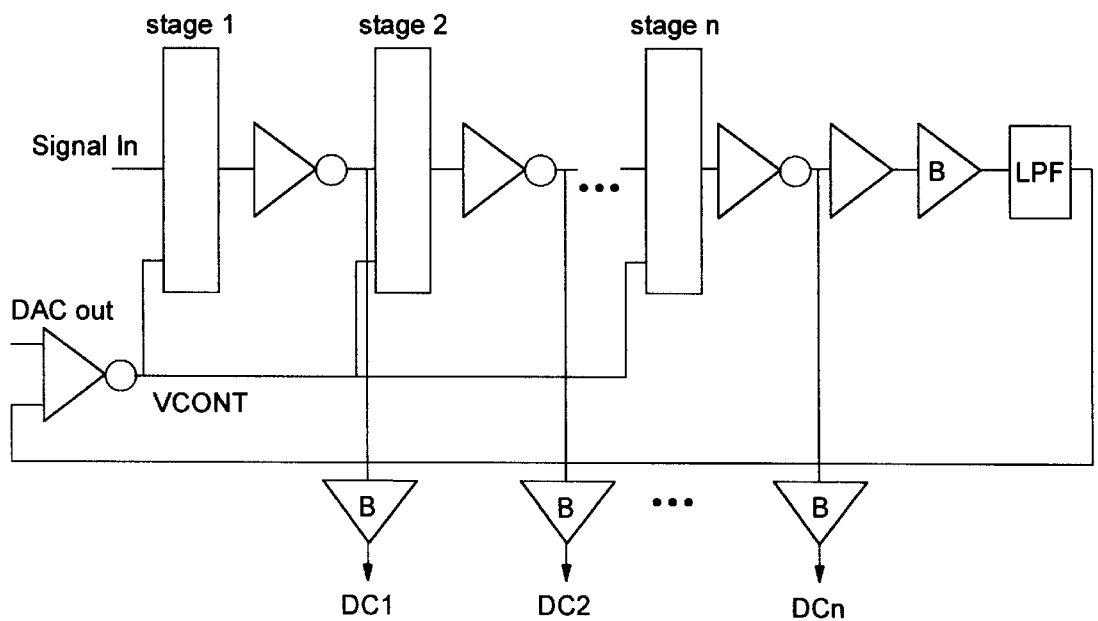
FIG. 7 illustrates the configuration of the second programmable duty cycle generator which provides a tap point output after each stage.

FIG. 7 illustrates the configuration of the second programmable duty cycle generator which is essentially the same as illustrated in FIG. 5 with the exception that tap point outputs are provided after select stages or after each stage. The inclusion of a buffer B at each tap point output isolates the output load from the internal circuit of the duty cycle generator. A duty cycle offset due to the buffer is compensated for by the insertion of a like buffer B in the loop after the last inverter in the VCDCG, before the LPF.

Figure 8:
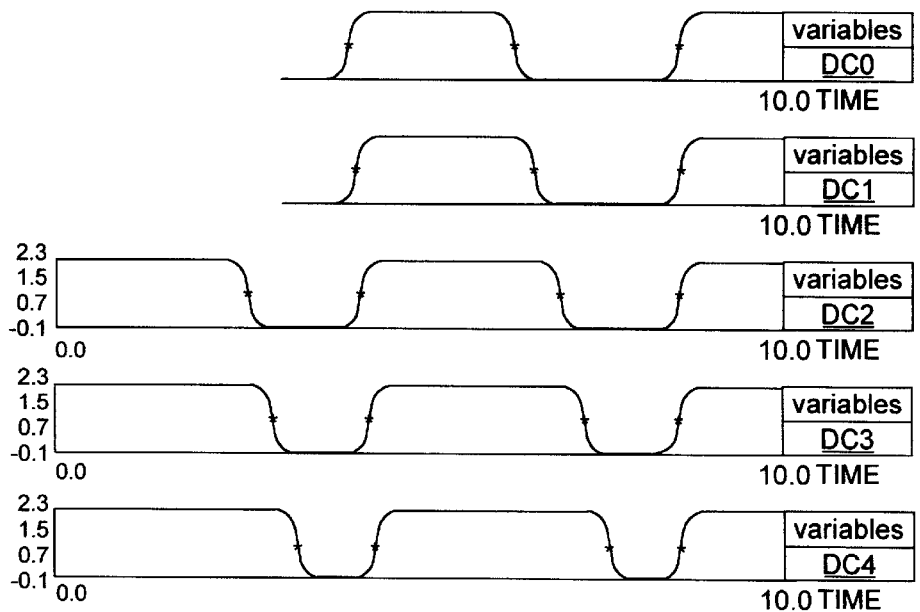
FIG. 8 illustrates timing waveforms of a 4 stage duty cycle generator with 4 tap point outputs which is driven by a primary duty cycle generator whose output is set to a 50/50 duty cycle.

FIG. 8 illustrates timing waveforms of a 4 stage duty cycle generator with 4 tap point outputs which is driven by a primary duty cycle generator whose output is set to 50/50. FIG. 8 illustrates the resulting waveforms for a configuration like that of FIG. 7 having four stages, each of which is available for output. The input signal is from a first duty cycle generator producing a 50/50 signal DC0 (the timing diagram shows a slight skew due to simulation resulting in a 49.75/50.25 duty cycle). The output duty cycle of the last stage, DC4, of this second duty cycle generator is set to 82.94/17.06. The cycle time for this example is 50 ns. The next to the last or third output, DC3, produces a duty cycle of 74.95/25.05, whereas the second and first tap points, DC2 and DC1, produce duty cycles of 65.59/33.41 and 58.23/41.67, respectively.

The ideal duty cycle delta or increment between adjacent tap points is (82.94−50)/4=8.24. Based on this increment per stage, the first tap point should have a duty cycle of: 50+8.24=58.24/41.76. The simulation shows a duty cycle of: 58.23/41.77. Therefore the error is (58.23−58.24)/58.24=−0.017%. If we continue down the path, the duty cycle at the second tap point is: 50+2(8.24)=66.48/33.52. The simulation shows a duty cycle of 66.59/33.41. Therefore the error is (66.48.−66.59)/66.48=−0.16%. The duty cycle at the third tap point is 50+3(8.24)=74.72/25.28. The simulation shows a duty cycle of 74.95/25.05. The error is (74.72−74.95)/74.72=−0.3%. Finally, the duty cycle at the fourth tap point is 50+4(8.24)=82.96/17.04. The simulation shows 82.94/17.06. The error is (82.94−82.96)/82.94=−0.024%.

As can be seen, the various tap points produce a distributed duty cycle, each having a constant, or nearly a constant fraction of the difference between the incoming signal's duty cycle and the final stage's duty cycle. Hence, multiple concurrently available duty cycles are available, each with a known and precise value.

In summary, the arrangement of FIGS. 6 and 7 provides concurrent multiple available duty cycle tap point outpoints with precision from an output source having any duty cycle.

The tap point duty cycles are evenly divided between the known duty cycle associated with the output of the first duty cycle generator and the last stage of the second duty cycle generator. Careful choice of the number of stages of each duty cycle generator, the selected duty cycles of duty cycle generators 1 and 2, and the number of tap points used in duty cycle generator 2 provides the user with numerous combinations of multiple, concurrent, and programmable duty cycles. The use of this approach enables many of the attributes discussed in U.S. patent application Ser. No. 10/020,528, filed Dec. 14, 2001.

The present invention provides a circuit which aligns the leading edges or trailing edges of multiple duty cycle tap point output signals from a programmable duty cycle generator. Multiple concurrent duty cycle output signals are generated with precision from an input signal having any duty cycle, and each of the multiple and programmable duty cycle tap point output signals are phase aligned with respect to each other and the source input signal.

FIG. 8 illustrates waveforms generated by the circuit of FIGS. 6 and 7. Note that each tap point output signal is displaced or phase shifted from the preceding tap point output signal and hence, the source input signal. In this example, the input signal's rising transition occurs at 3.68205 ns (50% point of Vdd). The first output tap point, DC1, has a corresponding transition at 3.84475 ns, representing a 162.7 ps delay or offset from the reference input. Subsequent tap points, DC2, DC3 and DC4, have rising transitions occurring at 4.00372, 4.16256 and 4.32476 ns respectively. The delays between subsequent stages of DC2, DC3 and DC4 are 158.96, 158.84 and 1.622 ps, respectively.

The present invention phase aligns each of these tap point output signals with respect to each other and the reference signal without distorting the duty cycles. The basic idea is to delay each of the stages by the precise delay needed to phase align each output signal without duty cycle distortion.

The use of typical delay elements will not provide zero duty cycle variance or delay tracking for precise alignment. Fundamentally, the final output DC4 in this example is the reference with respect to which all other tap points need to be phase aligned. Tap point 3, DC3, therefore arrives earlier than DC4 by an amount associated with the stage 4 delay. Tap point 2, DC2, arrives earlier than tap point 4 by the sum of the stage 3 and stage 4 delays. Similarly, tap point 1, DC1, arrives earlier than tap point 4 by the sum of the stage 2, 3, and 4 delays. Therefore, each tap point other than the final tap point must be shifted or delayed by varying amounts consistent with the availability of the final tap point output.

Figure 9:
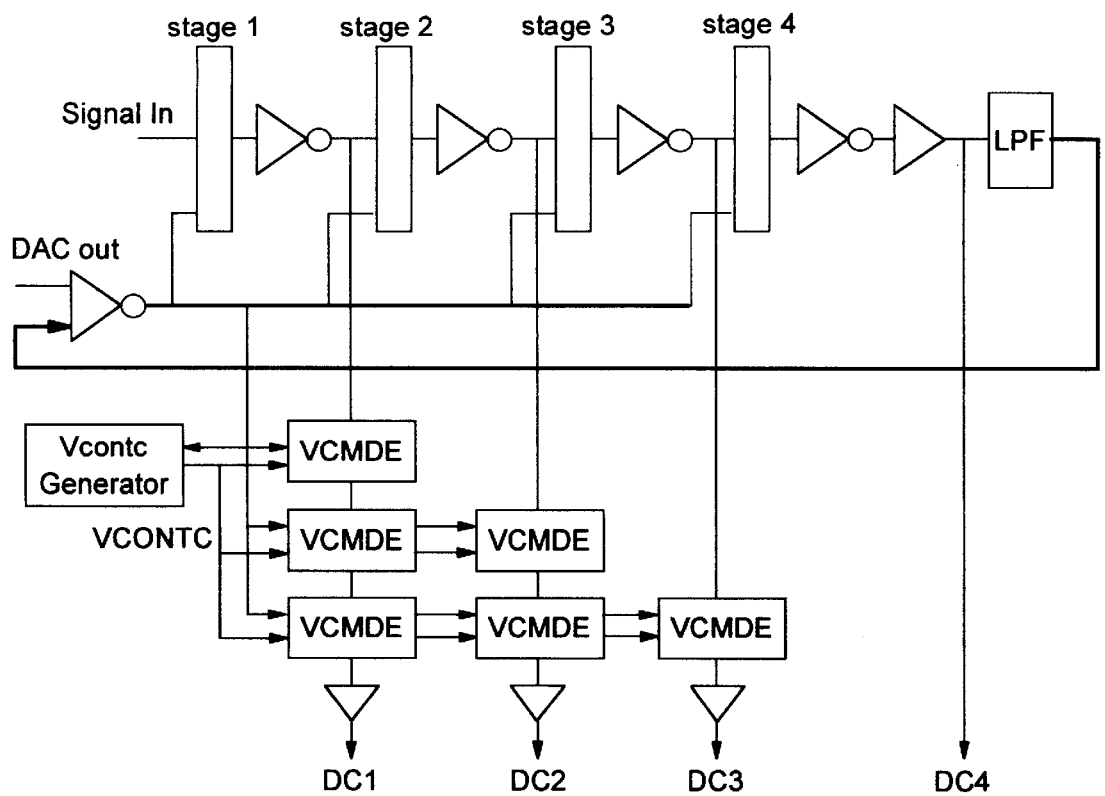
FIG. 9 is a high level block diagram of a single ended duty cycle correction circuit modified to provide phase aligned outputs which introduces a Vcontc generator and a Voltage Controlled Matching Delay Element (VCMDE).

FIG. 9 is a high level block diagram of a single ended duty cycle correction circuit modified to provide phase aligned outputs. FIG. 9 introduces a Vcontc generator and a Voltage Controlled Matching Delay Element (VCMDE).

Figure 10:
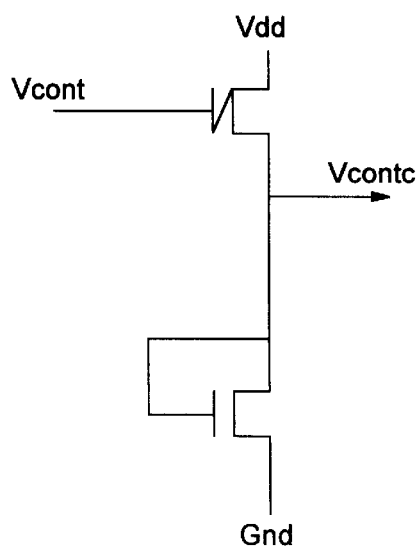
FIG. 10 illustrates a schematic of a Vcontc generator which generates the complement of the analog voltage Vcont by using a current mirror.

FIG. 10 illustrates a schematic of the Vcontc generator which generates the complement of the analog voltage Vcont by using a current mirror.

The Vcontc generator of FIG. 10 is in essence a current mirror. For example, if Vcont is Vdd/2, then Vcontc would equal Vdd/2, but if Vcont were Vdd/4, then Vcontc would be 3Vdd/4 under the assumption that the transconductances of the nfet and pfet are equal.

Each of the stages of the programmable duty cycle generator of FIGS. 2 and 7 comprises a current starved inverter wherein the control voltage Vcont is applied to both the PFET and the NFET control devices.

Figure 11:
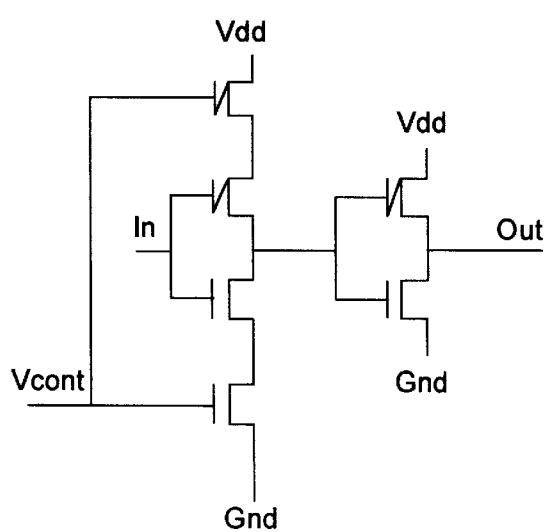
FIG. 11 illustrates a schematic of one complete stage of the programmable duty cycle generator which comprises a current starved inverter followed by a conventional inverter, wherein both the PFETs and the NFETs of the current starved inverter are controlled by Vcont to generate the desired duty cycle.

FIG. 11 illustrates a schematic of one complete stage of the programmable duty cycle generator which comprises a current starved inverter followed by a conventional inverter.

In FIG. 11 both the PFETs and the NFETs of the current starved inverter are controlled by Vcont to generate the desired duty cycle.

To effect the same delay of any given stage within the VCDCG implies tracking of the Vcont control voltage, but not applying it to both the pfet and nfet devices of the current starved inverter. In fact, a circuit should delay the rising and falling edges of the resulting signals without altering the pulse widths (duty cycle). To do this, both rising and falling edges must be delayed by the same exact amount. This can be accomplished by generating and applying the analog complement of the Vcont voltage, Vcontc.

Figure 12:
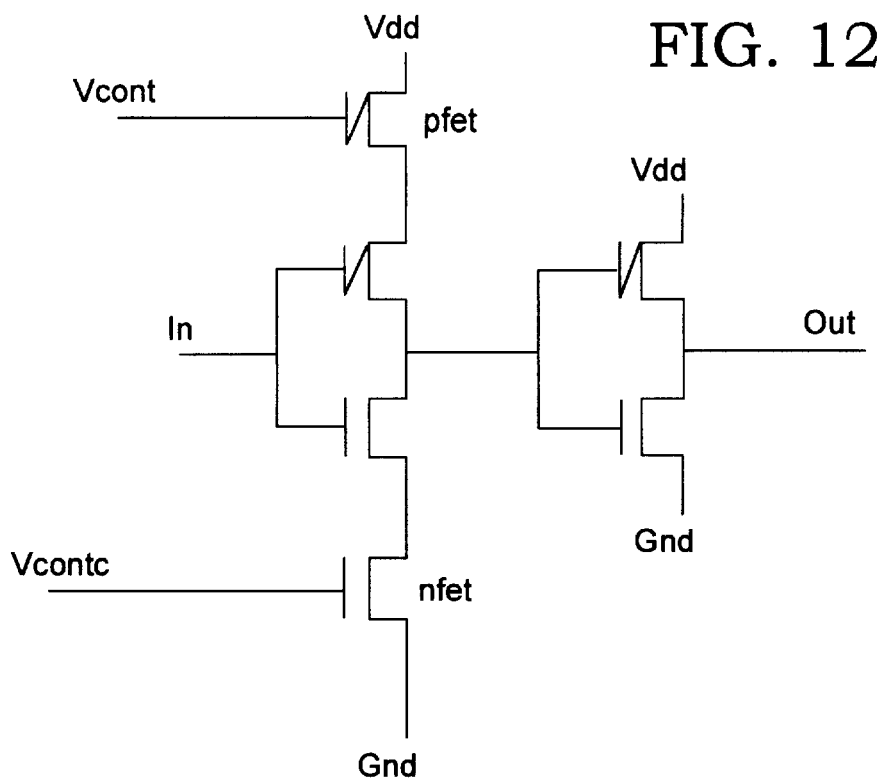
FIG. 12 illustrates a schematic circuit for the VCMDE, wherein for a rising edge alignment, Vcontc is applied to the nfet gate of the current starved inverter while Vcont is applied to the pfet gate of the current starved inverter.

FIG. 12 illustrates a schematic circuit of the VCDCG, wherein for a rising edge alignment, Vcontc is applied to the nfet gate of the current starved inverter while Vcont is applied to the pfet gate of the current starved inverter, which comprises a duplicate set of delay stages. Hence, the voltage controlled delay matching element is a current starved inverter with the pfet's gate connected to Vcont and the nfet's gate connected to Vcontc.

For a falling edge alignment, Vcontc is applied to the pfet gate while Vcont is applied to the nfet gate of the current starved inverter.

Referring to FIG. 9, elements labeled as VCMDE are the voltage controlled delay matching elements. They are replicas of the stages comprising the VCDCG. FIG. 12 illustrates the transistor schematic of a VCMDE, which is similar to the original stage as illustrated in FIG. 11. The only difference is the use of Vcontc to control the nfet in the current starved inverter. The application of Vcont to the pfet of the delay stage replica results in a rising delay which matches the stage of the VCDCG that is being mimicked. The application of Vcontc to the nfet results in a failing delay which is matched to the rising delay, thereby preserving the duty cycle while moving the pulse toward alignment.

Figure 13:
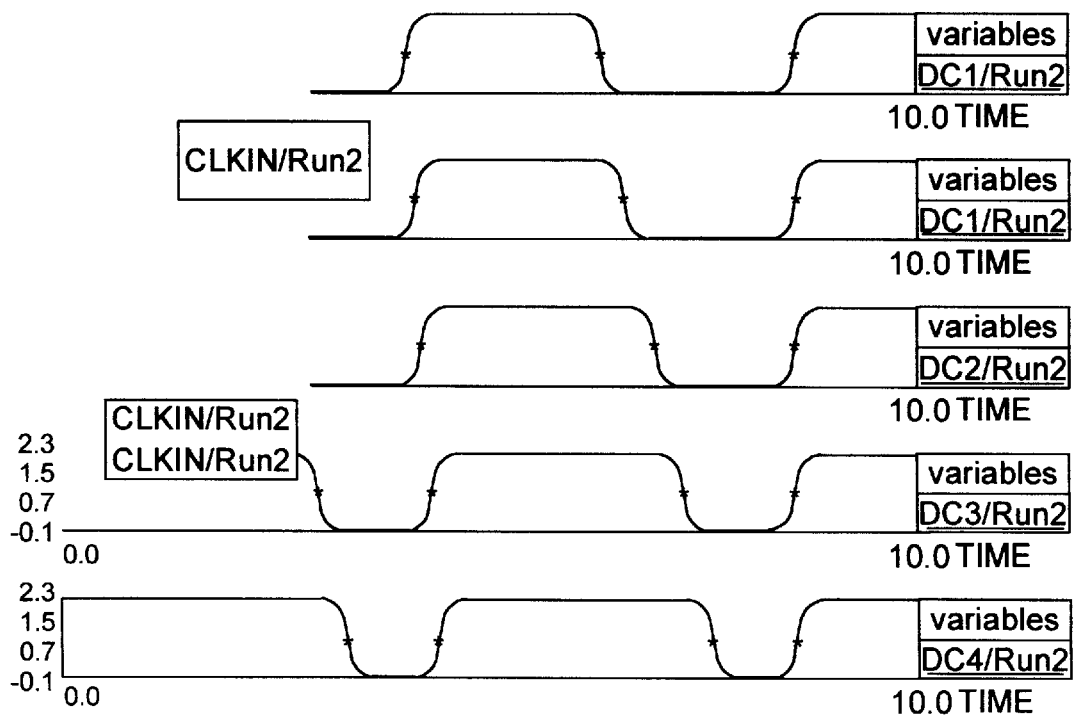
FIG. 13 illustrates the resulting phase alignment of the waveforms of FIG. 8 when the present invention is applied, which is for the four stage configuration of FIG. 9.

FIG. 13 illustrates the resulting phase alignment of the waveforms of FIG. 8 when the present invention is applied, which is for the four stage configuration of FIG. 9. Referring to FIG. 13, the final output tap point, DC4, has its rising transition at 4.32476 which is unaltered from the output shown in FIG. 8, as is expected. Tap point DC3 now has its rising transition at 4.32396 ns which is −0.8 ps within the desired reference of 4.32476. Tap point DC2 has its rising transition at 4.33005 ns which is +5.29 ps later than the reference. Finally, tap point DC1 has its rising transition occurring at 4.33604 ns which is 11.28 ps later than the reference.

The duty cycles at each of the tap points are very tightly coupled to the reference duty cycle that would have existed without the phase alignment. For example, the up time of the DC3 tap point DC3/RUN2 in FIG. 13) after phase alignment is 3.74781 ns compared to the reference non-aligned DC3 tap point (as shown in FIG. 8) which is 3.74729 ns. Hence, the up-time delta for the DC3 tap pint is 0.52 ps. The worst up-time degradation of 11.28 ps occurs at the DC1 tap point where the reference (unaligned) up time is 2.91164 ns and the phase aligned version is 2.92311 ns. This 11.28 ps error represents less than 0.4% overall duty cycle variance. Hence, we have demonstrated a means to phase align multiple outputs from a duty cycle generator with less than 0.4% variance in the desired duty cycle while introducing a total skew between the first and last output tap points of only 11.3 ps.

In summary, the present invention aligns multiple tap points from a precise duty cycle generator. The various tap points are shifted and delayed with precision to effect phase alignment with all tap points with minimal variance in the desired duty cycles of the various tap points. The present invention uses a set of mimic delay matching elements, VCDME, a voltage control generator and a voltage controlled duty cycle generator VCDCG.

While several embodiments and variations of the present invention for precision aligned multiple concurrent duty cycles from a programmable duty cycle generator are described in detail herein, it should be apparent that the disclosure and teachings of the present invention will suggest many alternative designs to those skilled in the art.

Having thus described our invention, what we claim as new, and desire to secure by Letters Patent is:

1. A programmable circuit for generating a plurality of phase aligned output clock signals, each having a different desired duty cycle, comprising:
    a first duty cycle generator for converting an input clock signal of unknown duty cycle to a known and programmable duty cycle;
    a second duty cycle generator connected in series with the output of the first duty cycle generator, including multiple stages providing multiple tap point output signals, each with a known and precise duty cycle value, for phase aligning the multiple tap point output signals with respect to each other.

2. The circuit of claim 1, wherein the leading edges of the multiple tap point output signals are phase aligned with respect to each other.

3. The circuit of claim 1, wherein the lagging edges of the multiple tap point output signals are phase aligned with respect to each other.

4. The circuit of claim 1, wherein one or more of the multiple output signals are delayed by a precise delay needed to phase align each of the multiple output signals.

5. The circuit of claim 4, wherein each precise delay is introduce by one or more voltage controlled delay matching elements which are replicas of the stages of the second duty cycle generator.

6. The circuit of claim 4, wherein the second duty cycle generator comprises:
    an operational amplifier for comparing an analog voltage representing the desired duty cycle with an analog feedback voltage Vcont, and generating an output control signal in response thereto;
    a voltage controlled duty cycle generator, responsive to the output control signal of the operational amplifier and having an input clock signal, for generating an output clock signal having the desired duty cycle, wherein the voltage controlled duty cycle generator comprises a plurality of stages;
    a low pass filter, responsive to the output clock signal, for measuring the duty cycle of the output clock signal and for generating the analog feedback voltage Vcont for the operational amplifier, thereby providing a closed feedback loop operation.

7. The circuit of claim 6, wherein the operational amplifier comprises an operational transconductance amplifier which generates an output current proportional to a difference of its input voltages; and
    a capacitor for receiving the generated output current and for charging or discharging the capacitor to produce a voltage across the capacitor which controls the voltage controlled duty cycle generator.

8. The circuit of claim 6, wherein each precise delay is introduced by one or more voltage controlled delay matching elements which are replicas of the stages of the voltage controlled delay duty cycle generator.

9. The circuit of claim 8, wherein each stage of the second duty cycle generator and the voltage controlled delay duty cycle generator comprises a current starved inverter which includes at least one PFET current source and at least one NFET current source.

10. The circuit of claim 9, wherein the second duty cycle generator includes a Vcontc generator for generating a complement of the analog feedback voltage Vcont.

11. The circuit of claim 10, wherein, in each voltage controlled delay matching elements, for a rising edge alignment, Vcontc is applied to the nfet gate of the current starved inverter while Vcont is applied to the pfet gate of the current starved inverter.

12. The circuit of claim 10, wherein, in each voltage controlled delay matching elements, for a falling edge alignment, Vcontc is applied to the pfet gate of the current starved inverter while Vcont is applied to the pnfet gate of the current starved inverter.

13. The circuit of claim 6, wherein the first duty cycle generator comprises:

an operational amplifier for comparing an analog voltage representing the desired duty cycle with an analog feedback voltage, and generating an output control signal in response thereto;

a voltage controlled duty cycle generator, responsive to the output control signal of the operational amplifier and having an input clock signal, for generating an output clock signal having the desired duty cycle, wherein the voltage controlled duty cycle generator comprises a plurality of stages; and a low pass filter, responsive to the output clock signal, for measuring the duty cycle of the output clock signal and for generating the analog feedback voltage for the operational amplifier, thereby providing a closed feedback loop operation.

14. The circuit of claim 13, wherein each operational amplifier comprises an operational transconductance amplifier for generating an output current proportional to a difference of its input voltages; and a capacitor for receiving the generated output current and for charging or discharges the capacitor to produce a voltage across the capacitor which controls the voltage controlled duty cycle generator.

15. The circuit of claim 13, wherein the output of a digital to analog converter is applied to a noninverting input of the operational amplifier, and the output of the low pass filter is applied to an inverting input of the operational amplifier, such that the voltage controlled duty cycle generator inverts the clock signal to produce the output clock signal.

16. The circuit of claim 13, wherein each voltage controlled duty cycle generator comprises a plurality of stages, each of which comprises a current starved inverter, comprised of PFET current sources and NFET current sources followed by a series inverter which presents a capacitive load to the current sources, to provide either additive or subtractive duty cycle corrections, the plurality of current starved inverters being controlled by the output control signal voltage of the operational amplifier which is connected to both the PFET current sources and the NFET current sources, and as the output control voltage increases, the PFET current sources provide a smaller current to charge the capacitive load, and the NFET current sources provide a larger current to discharge the capacitive load, such that the output waveform has a slow rising edge and a fast falling edge, and the difference in edge rates causes the output of the inverter to have a longer falling delay than a rising delay to produce a duty cycle that is controlled by the output control signal voltage of the operational amplifier.

17. The circuit of claim 16, wherein each of the plurality of stages is followed by an inverter.

18. The circuit of claim 13, wherein each low pass filter comprises an RC low pass filter.

19. The circuit of claim 1, including a buffer at each tap point output to isolate the output load from the internal circuit of the second duty cycle generator.

20. The circuit of claim 19, wherein the duty cycle offset due to each buffer is compensated for by the insertion of a like buffer in the feedback loop.

* * * * *